United States Patent
Wang et al.

(10) Patent No.: US 10,437,161 B2
(45) Date of Patent: Oct. 8, 2019

(54) METHOD AND APPARATUS FOR ADJUSTING EXPOSURE GAP

(71) Applicants: BOE TECHNOLOGY GROUP CO., LTD., Beijing (CN); Hefei Xinsheng Optoelectronics Technology Co., Ltd., Anhui (CN)

(72) Inventors: Hui Wang, Beijing (CN); Zhiqiang Wang, Beijing (CN); Guanglong Guo, Beijing (CN); Xing Tang, Beijing (CN); Wuyi Liao, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/992,865

(22) Filed: May 30, 2018

(65) Prior Publication Data

US 2019/0025715 A1   Jan. 24, 2019

(30) Foreign Application Priority Data

Jul. 20, 2017   (CN) .......................... 2017 1 0596794

(51) Int. Cl.
*G03F 7/20* (2006.01)
*G03F 9/00* (2006.01)

(52) U.S. Cl.
CPC ...... *G03F 7/70775* (2013.01); *G03F 7/70733* (2013.01); *G03F 9/703* (2013.01); *G03F 9/7026* (2013.01)

(58) Field of Classification Search
CPC .... G03F 7/7035; G03F 9/7026; G03F 9/7038; G03F 7/70566; G03F 9/00; G03F 9/70;
(Continued)

(56) References Cited

U.S. PATENT DOCUMENTS 6,765,647 B1 *   7/2004   Nishi ................. G03F 7/70808
                                                           250/492.2
2002/0197400 A1   12/2002   Kao et al.
2005/0018155 A1   1/2005   Cox et al.

FOREIGN PATENT DOCUMENTS

CN   1501172 A   6/2004
CN   1577098 A   2/2005
JP   H0945651 A   2/1997

OTHER PUBLICATIONS

First Office Action for Chinese Patent Application No. 201710596794.6 dated Apr. 3, 2018.

* cited by examiner

*Primary Examiner* — Michelle M Iacoletti
(74) *Attorney, Agent, or Firm* — Calfee, Halter & Griswold LLP

(57) ABSTRACT

A method and apparatus for adjusting an exposure gap in the manufacture of display panels. The method includes: setting a detection range of a detector based on a thickness of a substrate, wherein a position of a waveform corresponding to the thickness of the substrate is outside the detection range; in case a position of a waveform corresponding to a target exposure gap is outside the detection range, setting an intermediary exposure gap within the detection range; adjusting the exposure gap during detecting the exposure gap by the detector until the exposure gap is equal to the intermediary exposure gap, wherein the exposure gap is a distance between the substrate and a mask plate; and adjusting the exposure gap to the target exposure gap based on a difference between the target exposure gap and the intermediary exposure gap.

20 Claims, 6 Drawing Sheets

(58) Field of Classification Search
CPC ... G03F 7/70775; G03F 9/703; G04F 7/70641
See application file for complete search history.

METHOD AND APPARATUS FOR ADJUSTING EXPOSURE GAP

RELATED APPLICATIONS

The present application claims the benefit of Chinese Patent Application No. 201710596794.6, filed on Jul. 20, 2017, the entire disclosures of which are incorporated herein by reference.

TECHNICAL FIELD

The present disclosure relates to the field of display panel manufacturing technology, and in particular, to a method and an apparatus for adjusting an exposure gap.

BACKGROUND

In the exposure process for the fields of manufacturing liquid crystal displays, touch screens, etc., a proximity exposure machine is usually used. When using a proximity exposure machine, the device's detection of the exposure gap between the mask plate and the substrate is critical. The commonly used exposure gap detector is a spectroscopic interferometric detector. The detector is located at a position perpendicular to the substrate, and a spectroscopic spectrum analysis is performed by receiving the reflected light, thereby measuring the exposure gap.

SUMMARY

A first embodiment of the present disclosure provides a method for adjusting an exposure gap. The method includes the following steps: setting a detection range of a detector based on a thickness of a substrate, wherein the position of a waveform corresponding to the thickness of the substrate is outside the detection range; in case the position of a waveform corresponding to a target exposure gap is outside the detection range, setting an intermediary exposure gap within the detection range; adjusting the exposure gap during detecting the exposure gap by the detector, until the exposure gap is equal to the intermediary exposure gap; the exposure gap being a distance between the substrate and a mask plate; and adjusting the exposure gap to the target exposure gap based on a difference between the target exposure gap and the intermediary exposure gap.

In some embodiments, the step of setting the detection range of the detector based on the thickness of the substrate includes: determining the position of the waveform corresponding to the thickness of the substrate based on the thickness of the substrate; and setting the detection range based on the position of the waveform corresponding to the thickness of the substrate; wherein the position of the waveform corresponding to the thickness of the substrate and the position of the waveform corresponding to the target exposure gap are outside the detection range.

In some embodiments, the step of determining the position of the waveform corresponding to the thickness of the substrate based on the thickness of the substrate includes: substituting the thickness d of the substrate and a refractive index n of the substrate into a formula $P=d\times n$, obtaining the position P of the waveform corresponding to the thickness of the substrate.

In some embodiments, the step of adjusting the exposure gap during detecting the exposure gap by the detector, until the exposure gap is equal to the intermediary exposure gap includes: detecting the exposure gap by using the detector; and moving the substrate by using a platform of an exposure machine until the exposure gap is equal to the intermediary exposure gap.

In some embodiments, the step of adjusting the exposure gap to the target exposure gap based on the difference between the target exposure gap and the intermediary exposure gap includes: calculating the difference between the target exposure gap and the intermediary exposure gap; and based on the difference between the target exposure gap and the intermediary exposure gap, moving the substrate by using a platform of an exposure machine, so that the exposure gap is equal to the intermediary exposure gap.

In some embodiments, after the step of setting the detection range of the detector based on the thickness of the substrate, the method further includes: in case the position of the waveform corresponding to the target exposure gap is within the detection range, adjusting the exposure gap during detecting the exposure gap by the detector, until the exposure gap is equal to the target exposure gap.

A second embodiment of the present disclosure provides an apparatus for adjusting an exposure gap. The apparatus includes: a first setting module configured for setting a detection range of a detector based on a thickness of a substrate, wherein a position of a waveform corresponding to the thickness of the substrate is outside the detection range; a second setting module configured to, in case the position of a waveform corresponding to a target exposure gap is outside the detection range, set an intermediary exposure gap within the detection range; a first adjusting module configured for adjusting the exposure gap during detecting the exposure gap by the detector, until the exposure gap is equal to the intermediary exposure gap; the exposure gap being a distance between the substrate and a mask plate; and a second adjusting module configured for adjusting the exposure gap to the target exposure gap based on a difference between the target exposure gap and the intermediary exposure gap.

In some embodiments, the first adjusting module includes: a detection unit configured for detecting the exposure gap by using the detector; and a first moving unit configured for moving the substrate by using a platform of an exposure machine until the exposure gap is equal to the intermediary exposure gap.

In some embodiments, the second adjusting module includes: a calculating unit configured for calculating the difference between the target exposure gap and the intermediary exposure gap; and a second moving unit configured for based on the difference between the target exposure gap and the intermediary exposure gap, moving the substrate by using a platform of an exposure machine, so that the exposure gap is equal to the intermediary exposure gap.

In some embodiments, the apparatus for adjusting the exposure gap further includes: a third adjusting module configured to, in case the position of the waveform corresponding to the target exposure gap is within the detection range, adjust the exposure gap during detecting the exposure gap by the detector, until the exposure gap is equal to the target exposure gap.

A third embodiment of the present disclosure provides a computer device including a memory, a processor, and a computer program stored on the memory and executable on the processor; the method for adjusting the exposure gap according to any one of the above-mentioned embodiments is realized when the processor executes the computer program.

A fourth embodiment of the present disclosure provides a non-transitory computer-readable storage medium storing a computer program; the method for adjusting the exposure gap according to any one of the above-mentioned embodiments is realized when a processor executes the computer program.

A fifth embodiment of the present disclosure provides a computer program product; the method for adjusting the exposure gap according to any one of the above-mentioned embodiments is performed when instructions in the computer program product are executed by a processor.

Additional embodiments and advantages of the present disclosure will be set forth in the following description, and will be apparent from the description or be comprehended by practice of the disclosure.

DETAILED DESCRIPTION OF THE DISCLOSURE

Figure 1:
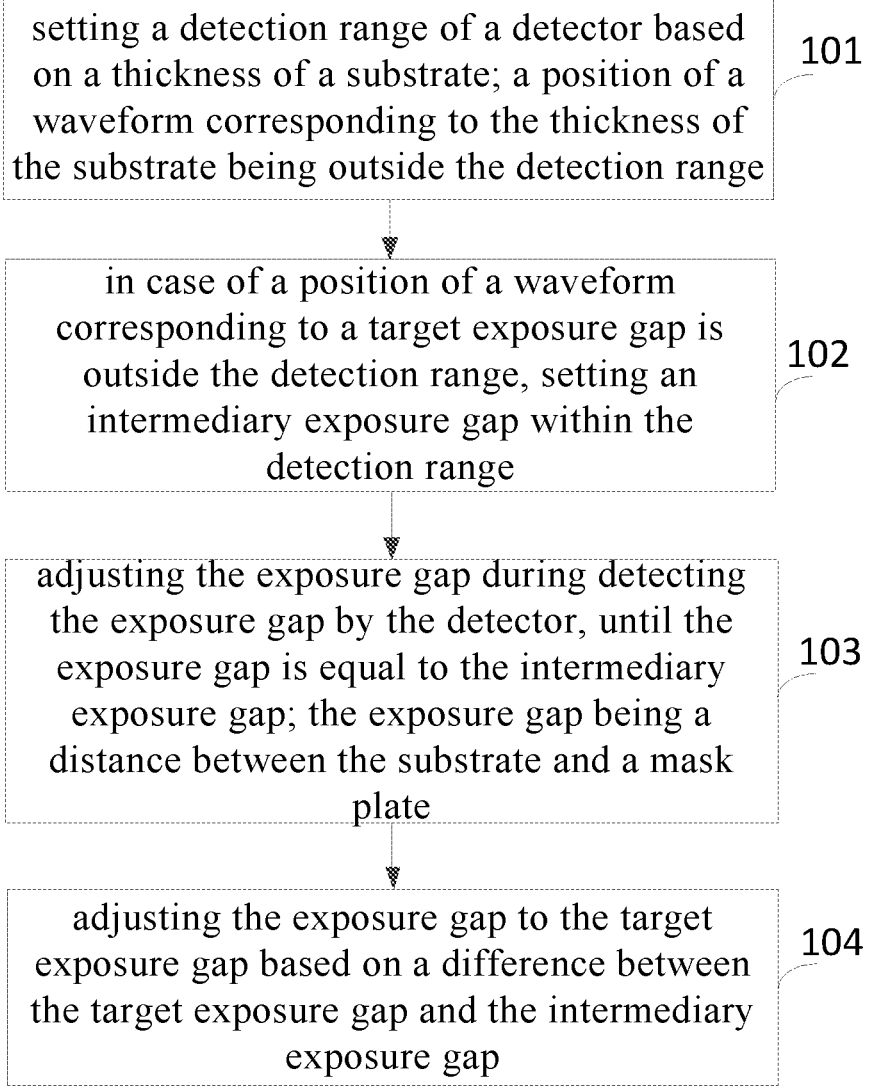
FIG. 1 is a flow chart of a method for adjusting an exposure gap provided by an embodiment of the present disclosure.

Embodiments of the present disclosure are described in detail below, examples of which are illustrated in the accompanying drawings, throughout which the same or similar reference numerals denote the same or similar elements or elements having the same or similar functions. The embodiments described below with reference to the accompanying drawings are exemplary and are intended to explain the present disclosure, but should not be construed as limiting the present disclosure.

The inventors have noticed that as the substrate is thinned, if a thin substrate is used in production, for the spectroscopic interferometer detector, an interference wave (corresponding to the thickness of the thin substrate) is formed by the thin substrate due to interference between the upper and lower surfaces of the thin substrate. This interference wave may fall within the detection range of the spectroscopic interferometric detector, thereby seriously affecting the detector's detection of the exposure gap, resulting in the exposure machine being unable to work. The current proximity exposure machine is thus difficult to complete the exposure process of the thin substrate, causing some limitations.

The present disclosure aims to solve at least to some extent one of the technical problems in the related art.

Hereinafter, a method and an apparatus for adjusting an exposure gap according to an embodiment of the present disclosure will be described with reference to the drawings.

FIG. 1 is a flow chart of a method for adjusting an exposure gap provided by an embodiment of the present disclosure.

As shown in FIG. 1, the method for adjusting an exposure gap includes the following steps.

Step 101, setting a detection range of a detector based on a thickness of a substrate.

Figure 2:
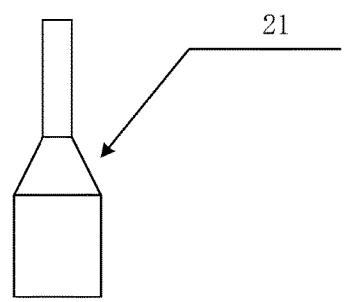
FIG. 2 is a schematic diagram of detecting an exposure gap in a proximity exposure machine provided by an embodiment of the present disclosure.
Figure 2:
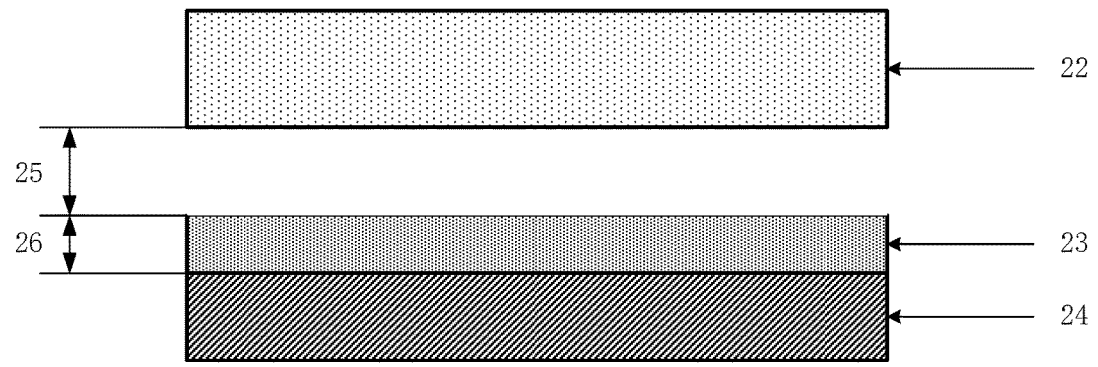
Figure 4:
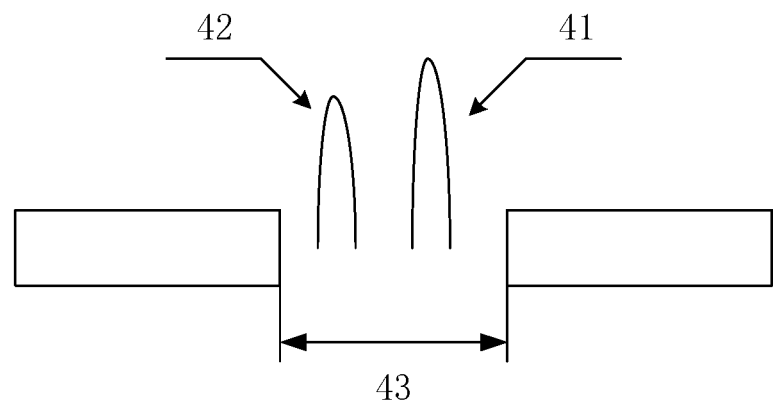
FIG. 4 is a schematic diagram showing a position of a waveform according to an embodiment of the present disclosure.

In the exposure process, when a spectroscopic interferometer detector is used to detect the exposure gap between the mask plate and the substrate, the positional relationship among the detector, the mask plate, the substrate, and the platform of the exposure machine is shown in FIG. 2. The detector 21 is located above the mask plate 22. The substrate 23 and the platform 24 of the exposure machine are located below the mask plate 22. The platform 24 of the exposure machine is used to carry the substrate 23. The detector 21 emits a detection wave vertically downwards and receives the reflected light of the detection wave, which is reflected at the interface(s) of the dielectric layers. The detector 21 can calculate the distance between the mask plate 22 and the substrate 23 by performing spectral analysis on the reflected light. By adjusting the distance between the mask plate 22 and the substrate 23, the target exposure gap 25 can be obtained. In practical applications, the target exposure gap 25 between the mask plate 22 and the substrate 23 corresponds to a position of a waveform (indicated by, for example, the waveform 41 in FIG. 4), and the thickness 26 of the substrate also corresponds to a position of a waveform (indicated by, for example, the waveform 42 in FIG. 4). A position of a waveform refers to a peak position of a (detected or preset) waveform, which usually corresponds to a distance between two interfaces that produce interference. If positions of these two waveforms are within the detection range, the position of the waveform corresponding to the target exposure gap 25 cannot be recognized by the detector 21. That is, the position of the waveform corresponding to the thickness of the substrate 23 may interfere with the detection of the target exposure gap 25. Therefore, when setting the detection range of the detector 21, the position of the waveform corresponding to the thickness 26 of the substrate is set to be outside the detection range.

In particular, the detection range of the detector can be set based on the thickness of the substrate, and the position of the waveform corresponding to the thickness of the substrate (i.e., the position of the disturbing waveform) is outside the detection range. The step of determining the position of the waveform corresponding to the thickness of the substrate based on the thickness of the substrate may include: substituting the thickness d of the substrate and a refractive index n of the substrate into a formula $P = d \times n$, obtaining the position P of the waveform corresponding to the thickness of the substrate Step 102, in case a position of a waveform corresponding to a target exposure gap is outside the detection range, setting an intermediary exposure gap within the detection range.

In particular, when setting the detection range of the detector, in order to make the position of the waveform corresponding to the thickness of the substrate outside the detection range, the initial detection range is usually reduced, thus the target exposure gap may be outside the detection range. A target exposure gap refers to a desired exposure gap for exposing the substrate.

In this case, an intermediary exposure gap within the detection range can be set. Since only the position of the waveform corresponding to the intermediary exposure gap exists within the detection range, the detection of the intermediary exposure gap can be realized without the influence caused by the position of the disturbing waveform.

Step 103, adjusting the exposure gap during detecting the exposure gap by the detector, until the exposure gap is equal to the intermediary exposure gap.

In particular, the detector can be used to detect the exposure gap; then the substrate is moved using the platform of the exposure machine until the exposure gap is equal to the intermediary exposure gap. When the detector detects an exposure gap equal to the intermediary exposure gap, the platform stops moving.

In practical applications, the platform of the exposure machine can be controlled to move from bottom to top. At the same time, the exposure gap between the substrate and the mask plate is detected so as to control the exposure gap to be gradually reduced to the intermediary exposure gap. In the initial stage of controlling the movement of the platform, the position of the waveform corresponding to the exposure gap may not be within the detection range. At this stage, the platform of the exposure machine may be continuously controlled to move upward until the position of the waveform corresponding to the exposure gap moves into the detection range. After that, through the measured exposure gap, it is determined whether the exposure gap between the substrate and the mask has been adjusted to the intermediary exposure gap.

Step 104, adjusting the exposure gap to the target exposure gap based on a difference between the target exposure gap and the intermediary exposure gap.

In practical applications, since the platform of the exposure machine moves with high accuracy, it is possible to adjust the exposure gap from the intermediary exposure gap to the target exposure gap by controlling the movement of the platform.

Specifically, the difference between the target exposure gap and the intermediary exposure gap may be calculated first; then, based on the difference, the substrate is moved by the platform of the exposure machine so that the exposure gap is equal to the target exposure gap.

In the embodiment of the present disclosure, the method for adjusting the exposure gap includes: setting a detection range of a detector based on a thickness of a substrate, wherein a position of a waveform corresponding to the thickness of the substrate is outside the detection range; in case a position of a waveform corresponding to a target exposure gap is outside the detection range, setting an intermediary exposure gap within the detection range; adjusting the exposure gap during detecting the exposure gap by the detector, until the exposure gap is equal to the intermediary exposure gap; the exposure gap being a distance between the substrate and a mask plate; and adjusting the exposure gap to the target exposure gap based on a difference between the target exposure gap and the intermediary exposure gap. Therefore, the detection range corresponding to the thickness of the substrate is excluded, and downtime of the detector can be avoided. Moreover, by setting the intermediary exposure gap, the exposure gap can be adjusted to the target exposure gap based on the difference between the target exposure gap and the intermediary exposure gap, thereby realizing the adjustment of the exposure gap for the thin substrate. The technical problem in the prior art that the proximity exposure machine can hardly complete the exposure process for the thin substrate due to the interference between the upper and lower surfaces of the thin substrate can thus be solved.

In the context of the present disclosure, the term "substrate" may refer to a variety of substrates such as glass substrates, resin substrates, rigid substrates, flexible substrates, and the like.

Figure 3:
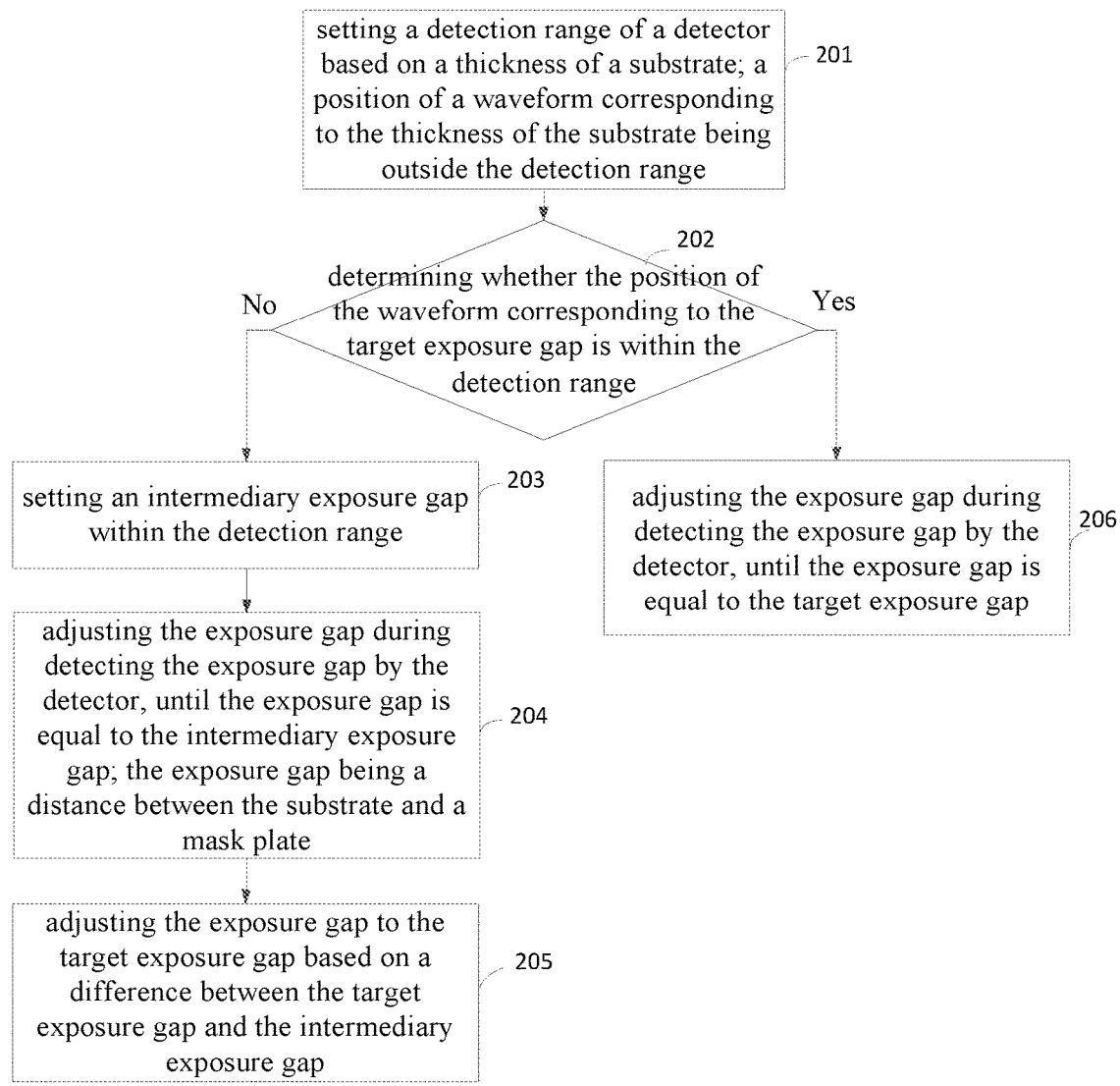
FIG. 3 is a flow chart of a method for adjusting an exposure gap provided by another embodiment of the present disclosure.

FIG. 3 is a flow chart of a method for adjusting an exposure gap provided by another embodiment of the present disclosure.

As shown in FIG. 3, the method for adjusting an exposure gap may include the following steps.

Step 201, setting a detection range of a detector based on a thickness of a substrate.

Figure 5:
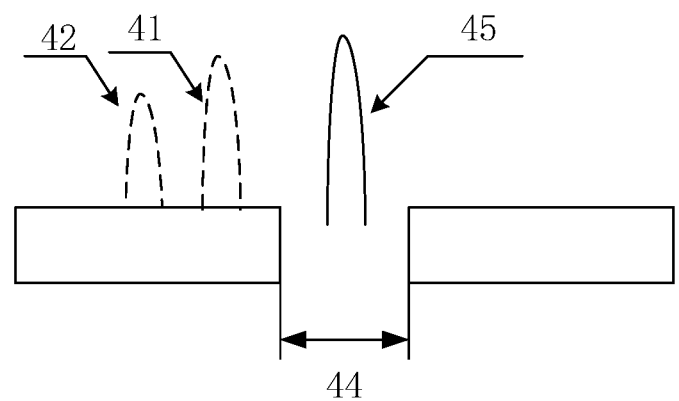
FIG. 5 is a schematic diagram showing a position of a waveform according to another embodiment of the present disclosure.

Specifically, the detector can detect the position of the waveform corresponding to the air between the mask plate and the substrate, and the position of the waveform corresponding to the thickness of the substrate. If the positions of these two waveforms are within the detection range, the detector will not be able to recognize the position of the waveform corresponding to the target exposure gap. For example, since the medium between the mask plate and the substrate is air and the refractive index of air is 1, when the target exposure gap is 200 μm, based on the waveform position formula P=d×n, the position of the waveform corresponding to the target exposure gap can be calculated to be 200 μm. If the refractive index of the substrate is 1.5 and the thickness of the substrate is 200 μm, based on the waveform position formula P=d×n, the position of the waveform corresponding to the thickness of the substrate can be calculated to be 300 μm. In the application scenario shown in FIG. 4, when the detection range 43 is 50 μm to 450 μm, both the waveform position 42 (200 μm) corresponding to the target exposure gap and the waveform position 41 (300 μm) corresponding to the disturbing wave are within the detection range 43. That is, when the target exposure gap is comparable to the thickness of the substrate, the waveform position corresponding to the target exposure gap and the waveform position corresponding to the disturbing wave are very close to each other or even coincide with each other. Therefore, in this case, the detector cannot recognize the waveform position of the waveform 42 corresponding to the target exposure gap, and thus the exposure machine cannot work. In this case, in order to make the waveform position 41 of the disturbing wave corresponding to the thickness of the substrate outside the detection range, the detection range of the detector can be adjusted. For example, in the application scenario shown in FIG. 5, the detection range 44 may be set as 350 μm to 450 μm, so that the position 41 (300 μm) of the disturbing wave corresponding to the thickness of the substrate is out of the detection range, downtime of the detector can be effectively avoided. However, as shown in FIG. 5, since the detection range can be set variously, the waveform 42 corresponding to the target exposure gap may also be out of the detection range. Therefore, if the waveform 42 corresponding to the target exposure gap has been excluded from the detection range, a manner of setting an intermediary exposure gap is used in order to obtain the target exposure gap. The waveform 45 corresponding to the intermediary exposure gap is within the detection range 44, and the specific method will be described in detail in the subsequent steps.

Step 202, determining whether the position of the waveform corresponding to the target exposure gap is within the detection range.

In practical applications, if the position of the waveform corresponding to the target exposure gap is outside the detection range, the exposure gap may be adjusted during detection of the exposure gap by the detector until the exposure gap is equal to the intermediary exposure gap. The exposure gap being a distance between the substrate and the mask plate; and the exposure gap can be adjusted to the target exposure gap based on the difference between the target exposure gap and the intermediary exposure gap. If the position of the waveform corresponding to the target exposure gap is within the detection range, the position of the waveform corresponding to the target exposure gap can be directly detected by the detector during the movement of the substrate. When the detector directly detects the position of the waveform corresponding to the target exposure gap, the substrate is stopped, and now the exposure gap is equal to the target exposure gap.

Specifically, if the position of the waveform corresponding to the target exposure gap is outside the detection range, step 203 to step 205 are performed, and adjustment is performed by using the intermediary exposure gap; if the position of the waveform corresponding to the target exposure gap is within the detection range, step 206 is performed to directly adjust the exposure gap to the target exposure gap.

Step 203, setting an intermediary exposure gap within the detection range.

Specifically, after the detection range of the detector is set so that the position of the waveform corresponding to the thickness of the substrate is outside the detection range, the target exposure gap required by the exposure process may also be out of the detection range due to the reduction of the detection range. At this time, in order to enable the detector to still be able to detect the exposure gap accurately, an intermediary exposure gap within the detection range can be set. Since the position of the waveform corresponding to the intermediary exposure gap is within the detection range, the detector can obtain accurate detection results. For example, as shown in FIG. 5, when the detection range of the detector is set as 350 µm to 450 µm, since the refractive index of air is 1, the position of the waveform corresponding to the intermediary exposure gap is indicated with the reference sign "45" in FIG. 5. Therefore, the intermediary exposure gap can be set to 400 µm so that the position of the waveform corresponding to the intermediary exposure gap is within the detection range.

Step 204, adjusting the exposure gap during detecting the exposure gap by the detector, until the exposure gap is equal to the intermediary exposure gap; the exposure gap is a distance between the substrate and a mask plate.

Specifically, the platform of the exposure machine may be moved to a preset position for detecting the exposure gap, which is typically located within the detection range of the detector or close to the detection range. After the platform of the exposure machine moves to the preset position for detecting the exposure gap, the exposure gap can be detected. If the detection result does not reach the intermediary exposure gap, the exposure machine is controlled to adjust the exposure gap until the exposure gap detected by the detector reaches the intermediary exposure gap. For example, the detection range of the detector is set as 350 µm to 450 µm, the platform of the exposure machine moves to the preset position for detecting the exposure gap. If the detection result is 430 µm, the platform of the exposure machine can be controlled to move. After the platform moves, the exposure gap is detected again until the detected exposure gap reaches 400 µm±5 µm.±5 µm is a reference error of the exposure gap.

In practical applications, since the detection range set for the detector may be small, after the platform of the exposure machine moves to the preset position for detecting the exposure gap, the position of the waveform corresponding to the exposure gap may not be within the detection range. In this case, by controlling the movement of the platform, the exposure gap can be located within the detection range first; the exposure gap can then be adjusted by the exposure machine until the exposure gap detected by the detector reaches the intermediary exposure gap.

Step 205, adjusting the exposure gap to the target exposure gap based on a difference between the target exposure gap and the intermediary exposure gap.

In practical applications, since the platform of the exposure machine moves with high accuracy, it is possible to adjust the exposure gap from the intermediary exposure gap to the target exposure gap by controlling the movement of the platform. For example, the intermediary exposure gap is 400 µm and the target exposure gap is 200 µm. After the exposure gap detected by the detector reaches the intermediary exposure gap of 400 µm, the platform of the exposure machine can be lifted by 200 µm with high accuracy so as to reach the target exposure gap of 200 µm.

Step 206, adjusting the exposure gap during detecting the exposure gap by the detector, until the exposure gap is equal to the intermediary exposure gap.

Specifically, if the position of the waveform corresponding to the target exposure gap is within the detection range, the exposure gap may be adjusted during detection of the exposure gap by the detector until the exposure gap is equal to the target exposure gap.

In the embodiment of the disclosure, the detection range of the detector is set based on the thickness of the substrate, wherein the position of the waveform corresponding to the thickness of the substrate is outside the detection range. In case the position of the waveform corresponding to the target exposure gap is within the detection range: the exposure gap is adjusted during detecting the exposure gap by the detector, until the exposure gap is equal to the target exposure gap. In case a position of a waveform corresponding to a target exposure gap is outside the detection range: an intermediary exposure gap is set within the detection range; the exposure gap is adjusted during detecting the exposure gap by the detector, until the exposure gap is equal to the intermediary exposure gap; the exposure gap is a distance between the substrate and a mask plate; and the exposure gap is adjusted to the target exposure gap based on a difference between the target exposure gap and the intermediary exposure gap. Therefore, the detection range corresponding to the thickness of the substrate is excluded, and downtime of the detector can be avoided. Moreover, by setting the intermediary exposure gap, the exposure gap can be adjusted to the target exposure gap based on the difference between the target exposure gap and the intermediary exposure gap, thereby realizing the adjustment of the exposure gap for the thin substrate. The technical problem in the prior art that the proximity exposure machine can hardly complete the exposure process for the thin substrate due to the interference between the upper and lower surfaces of the thin substrate can thus be solved.

In order to implement the above embodiments, the present disclosure also provides an apparatus for adjusting an exposure gap.

Figure 6:
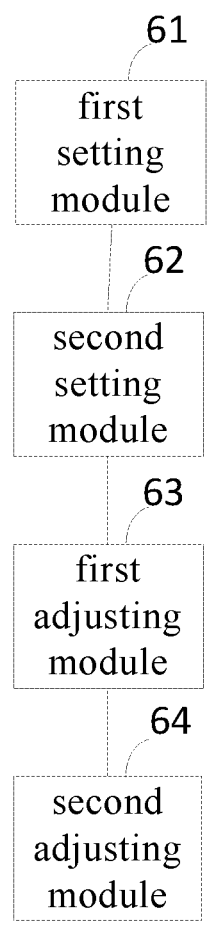
FIG. 6 is a structural schematic diagram of an apparatus for adjusting an exposure gap according to an embodiment of the present disclosure.

FIG. 6 is a structural schematic diagram of an apparatus for adjusting an exposure gap according to an embodiment of the present disclosure.

As shown in FIG. 6, the apparatus includes: a first setting module 61, a second setting module 62, a first adjusting module 63 and a second adjusting module 64.

The first setting module 61 is configured to set a detection range of a detector based on a thickness of a substrate, wherein a position of a waveform corresponding to the thickness of the substrate is outside the detection range.

The second setting module 62 is configured to in case a position of a waveform corresponding to a target exposure gap is outside the detection range, set an intermediary exposure gap within the detection range.

The first adjusting module 63 is configured to adjust the exposure gap during detecting the exposure gap by the detector, until the exposure gap is equal to the intermediary exposure gap; the exposure gap is a distance between the substrate and a mask plate.

The second adjusting module 64 is configured to adjust the exposure gap to the target exposure gap based on a difference between the target exposure gap and the intermediary exposure gap.

It should be noted that the foregoing description on the embodiments of the method for adjusting an exposure gap is also applicable to the apparatus for adjusting an exposure gap in this embodiment, which will not be described herein.

Figure 7:
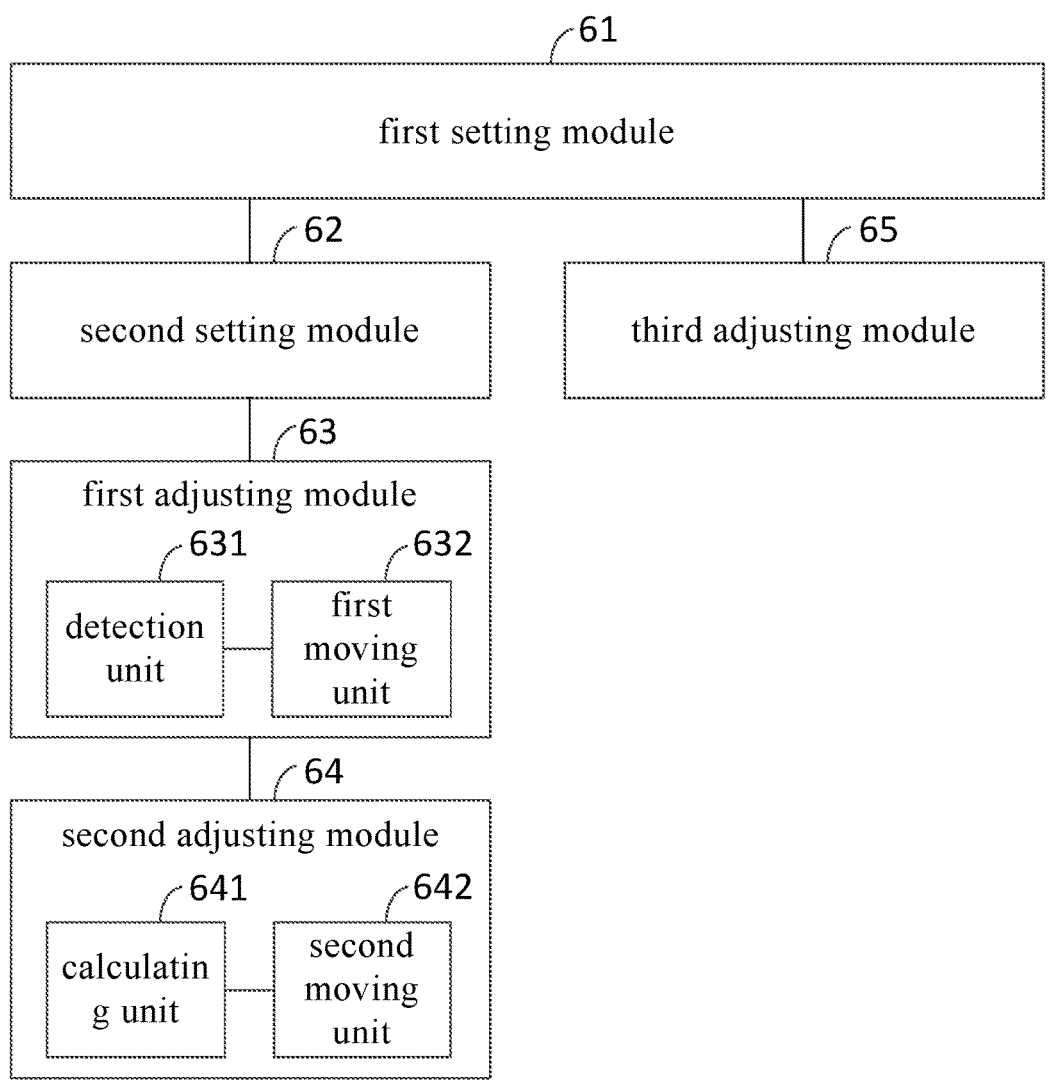
FIG. 7 is a structural schematic diagram of an apparatus for adjusting an exposure gap according to another embodiment of the present disclosure.

Based on the above embodiments, an embodiment of the present disclosure further provides an apparatus for adjusting an exposure gap. FIG. 7 is a structural schematic diagram of an apparatus for adjusting an exposure gap according to another embodiment of the present disclosure.

As shown in FIG. 7, the first adjusting module 63 may include a detection unit 631 and a first moving unit 632.

The detection unit 631 is configured to detect the exposure gap by using the detector.

The first moving unit 632 is configured to move the substrate by using a platform of an exposure machine until the exposure gap is equal to the intermediary exposure gap.

The second adjusting module 64 may include a calculating unit 641 and a second moving unit 642.

The calculating unit 641 is configured to calculate the difference between the target exposure gap and the intermediary exposure gap.

The second moving unit 642 is configured to based on the difference between the target exposure gap and the intermediary exposure gap, move the substrate by using a platform of an exposure machine, so that the exposure gap is equal to the intermediary exposure gap.

The apparatus for adjusting the exposure gap may further include a third adjusting module 65. The third adjusting module 65 is configured to, in case the position of the waveform corresponding to the target exposure gap is within the detection range, adjust the exposure gap during detecting the exposure gap by the detector, until the exposure gap is equal to the target exposure gap.

In the embodiment of the disclosure, the detection range of the detector is set based on the thickness of the substrate, wherein the position of the waveform corresponding to the thickness of the substrate is outside the detection range. In case the position of the waveform corresponding to the target exposure gap is within the detection range: the exposure gap is adjusted during detecting the exposure gap by the detector, until the exposure gap is equal to the target exposure gap. In case a position of a waveform corresponding to a target exposure gap is outside the detection range: an intermediary exposure gap is set within the detection range; the exposure gap is adjusted during detecting the exposure gap by the detector, until the exposure gap is equal to the intermediary exposure gap; the exposure gap is a distance between the substrate and a mask plate; and the exposure gap is adjusted to the target exposure gap based on a difference between the target exposure gap and the intermediary exposure gap. Therefore, the detection range corresponding to the thickness of the substrate is excluded, and downtime of the detector can be avoided. Moreover, by setting the intermediary exposure gap, the exposure gap can be adjusted to the target exposure gap based on the difference between the target exposure gap and the intermediary exposure gap, thereby realizing the adjustment of the exposure gap for the thin substrate. The technical problem in the prior art that the proximity exposure machine can hardly complete the exposure process for the thin substrate due to the interference between the upper and lower surfaces of the thin substrate can thus be solved.

In order to implement the above embodiments, the present disclosure also provides a computer device including a memory, a processor, and a computer program stored on the memory and executable on the processor; the method for adjusting the exposure gap according to any one of the above-mentioned embodiments is realized when the processor executes the computer program.

The processor is specifically configured to perform the following steps: setting a detection range of a detector based on a thickness of a substrate, wherein a position of a waveform corresponding to the thickness of the substrate is outside the detection range; in case a position of a waveform corresponding to a target exposure gap is outside the detection range, setting an intermediary exposure gap within the detection range; adjusting the exposure gap during detecting the exposure gap by the detector, until the exposure gap is equal to the intermediary exposure gap; the exposure gap being a distance between the substrate and a mask plate; and adjusting the exposure gap to the target exposure gap based on a difference between the target exposure gap and the intermediary exposure gap.

In order to implement the above embodiments, the present disclosure also provides a non-transitory computer-readable storage medium storing a computer program; wherein a method for adjusting an exposure gap can be realized when a processor executes the computer program. The method includes: setting a detection range of a detector based on a thickness of a substrate, wherein a position of a waveform corresponding to the thickness of the substrate is outside the detection range; in case a position of a waveform corresponding to a target exposure gap is outside the detection range, setting an intermediary exposure gap within the detection range; adjusting the exposure gap during detecting the exposure gap by the detector, until the exposure gap is equal to the intermediary exposure gap; the exposure gap being a distance between the substrate and a mask plate; and adjusting the exposure gap to the target exposure gap based on a difference between the target exposure gap and the intermediary exposure gap.

In order to implement the above embodiments, the present disclosure also provides a computer program product. A method for adjusting a n exposure gap can be performed when instructions in the computer program product are executed by a processor. The method includes: setting a detection range of a detector based on a thickness of a substrate, wherein a position of a waveform corresponding to the thickness of the substrate is outside the detection range; in case a position of a waveform corresponding to a target exposure gap is outside the detection range, setting an intermediary exposure gap within the detection range; adjusting the exposure gap during detecting the exposure gap by the detector, until the exposure gap is equal to the intermediary exposure gap; the exposure gap being a distance between the substrate and a mask plate; and adjusting the exposure gap to the target exposure gap based on a difference between the target exposure gap and the intermediary exposure gap.

In the description of the present specification, the description of the reference terms "an embodiment", "some embodiments", "an example", "a specific example", or "some examples" or the like means a specific feature structure, material, or characteristic described in conjunction with the embodiment or example is included in at least one embodiment or example of the present disclosure. In this specification, the schematic representation of the above terms does not necessarily have to refer to the same embodiment or example. Furthermore, the described specific feature, structure, material, or characteristic may be combined in any suitable manner in any one or more of the embodiments or examples. In addition, those skilled in the art may combine and integrate the different embodiments or examples described in this specification and features of different embodiments or examples without conflicting with each other.

Furthermore, the terms "first" and "second" are used for descriptive purposes only, and are not to be construed as indicating or implying relative importance or implicitly indicating the number of indicated technical features. Thus, features defined as "first", "second" may explicitly or implicitly include at least one such feature. In the description of the present disclosure, the meaning of "plurality" is at least two, such as two, three, etc., unless specifically defined otherwise.

Any process or method described in the flow charts or described elsewhere herein may be read to mean one or more modules, sections, or portions of codes in an executable instruction for implementing the steps of a custom logic function or process. The scope of the preferred embodiment of the present disclosure includes additional implementations in which functions may be performed in a sequence that is not shown or discussed, including in a substantially simultaneous manner or in reverse order depending on the function involved. It will be understood by those skilled in the art to which the embodiments of the present disclosure pertain.

The logic and/or steps represented in the flow chart or otherwise described herein, for example, may be considered as a sequence listing of executable instructions for implementing logical functions, and may be embodied in any computer-readable medium, for use by an instruction execution system, apparatus, or device (e.g., a computer-based system, a system including a processor, or other systems that can fetch instructions from an instruction execution system, apparatus, or device and execute instructions), or for use in conjunction with these instruction execution systems, apparatuses, or devices. In this specification, a "computer-readable medium" can be any apparatus that can contain, store, communicate, propagate, or transport the program for use by the instruction execution system, apparatus, or device, or for use in conjunction with the instruction execution system, apparatus, or device. More specific examples (non-exhaustive listings) of a computer-readable medium include the following: an electrical connection (electronic device) having one or more wires, a portable computer disk cartridge (magnetic device), random access memory (RAM), read-only memory (ROM), erasable editable read-only memory (EPROM or flash memory), fiber optic devices, and portable compact disk read-only memory (CDROM). In addition, the computer-readable medium may even be paper or other suitable medium on which the program is printed, since it may be for example, scanned optically, and then the program can be obtained electronically by editing, interpreting or, if necessary, processing in other suitable ways and then stored in computer memory.

It should be understood that portions of the present disclosure may be implemented in hardware, software, firmware, or a combination thereof. In the above embodiments, a plurality of steps or methods may be implemented using software or firmware stored in a memory and executed by a suitable instruction execution system. For example, if implemented in hardware, as in another embodiment, it can be implemented using any one or a combination of the following techniques known in the art: discrete logic circuit with logic gates for implementing logic functions on data signals, dedicated integrated circuits with suitable combinational logic gates, programmable gate arrays (PGA), field programmable gate arrays (FPGA), etc.

Persons of ordinary skill in the art may understand that all or part of steps in the method of implementing the foregoing embodiment may be performed by a program instructing the relevant hardware, and the program may be stored in a computer-readable storage medium. When executed, the program performs one or a combination of the steps of the above method embodiments.

In the context of the disclosure, each "unit" and "module" in the embodiments can be realized by a computer (e.g. personal computer) or a combination of a computer and a suitable sensor; the processing of each "unit" and "module" can be realized e.g. by a processor in the computer.

In addition, the functional unit in each embodiment of the present disclosure may be integrated in a processing module, the functional unit may also exist alone physically, or two or more functional units may be integrated in one module. The above integrated module can be implemented in the form of hardware or in the form of a software function module. The integrated module can also be stored in a computer readable storage medium if it is implemented in the form of a software functional module and sold or used as an independent product.

The above-mentioned storage medium may be a read-only memory, a magnetic disk or an optical disk, and the like. Although embodiments of the present disclosure have been shown and described above, it will be understood that the above embodiments are exemplary and not to be construed as limiting the present disclosure, and that those of ordinary skill in the art may make changes, modifications, substitutions and variations to the above embodiments within the scope of the present disclosure.

What is claimed is:

1. A method for adjusting an exposure gap, wherein the exposure gap is a distance between a substrate and a mask plate, comprising:
    setting a detection range of a detector based on a thickness of a substrate, wherein a position of a waveform corresponding to the thickness of the substrate is outside the detection range;
    in case a position of a waveform corresponding to a target exposure gap is outside the detection range, setting an intermediary exposure gap within the detection range;
    detecting the exposure gap using a detector;
    adjusting the exposure gap while detecting the exposure gap using the detector until the exposure gap is equal to the intermediary exposure gap; and
    adjusting the exposure gap to the target exposure gap based on a difference between the target exposure gap and the intermediary exposure gap.

2. The method according to claim 1, wherein setting the detection range of the detector based on the thickness of the substrate comprises:
- determining the position of the waveform corresponding to the thickness of the substrate based on the thickness of the substrate; and
- setting the detection range based on the position of the waveform corresponding to the thickness of the substrate, wherein the position of the waveform corresponding to the thickness of the substrate and the position of the waveform corresponding to the target exposure gap are outside the detection range.

3. The method according to claim 2, wherein determining the position of the waveform corresponding to the thickness of the substrate based on the thickness of the substrate comprises:
- substituting the thickness, d, of the substrate and a refractive index, n, of the substrate into a formula P=d×n, obtaining the position, P, of the waveform corresponding to the thickness of the substrate.

4. The method according to claim 1, wherein adjusting the exposure gap while detecting the exposure gap using the detector until the exposure gap is equal to the intermediary exposure gap comprises:
- detecting the exposure gap using the detector; and
- moving the substrate by using a platform of an exposure machine until the exposure gap is equal to the intermediary exposure gap.

5. The method according to claim 1, wherein adjusting the exposure gap to the target exposure gap based on the difference between the target exposure gap and the intermediary exposure gap comprises:
- calculating the difference between the target exposure gap and the intermediary exposure gap; and
- based on the difference between the target exposure gap and the intermediary exposure gap, moving the substrate by using a platform of an exposure machine, so that the exposure gap is equal to the intermediary exposure gap.

6. The method according to claim 1, wherein after setting the detection range of the detector based on the thickness of the substrate, the method further comprises:
- in case the position of the waveform corresponding to the target exposure gap is within the detection range, adjusting the exposure gap while detecting the exposure gap using the detector until the exposure gap is equal to the target exposure gap.

7. A computer device, comprising a memory, a processor, and a computer program stored on the memory and executable on the processor, wherein the method for adjusting the exposure gap according to claim 1 is realized when the processor executes the computer program.

8. The computer device according to claim 7, wherein setting the detection range of the detector based on the thickness of the substrate comprises:
- determining the position of the waveform corresponding to the thickness of the substrate based on the thickness of the substrate; and
- setting the detection range based on the position of the waveform corresponding to the thickness of the substrate, wherein the position of the waveform corresponding to the thickness of the substrate and position of the waveform corresponding to the target exposure gap are outside the detection range.

9. The computer device according to claim 8, wherein determining the position of the waveform corresponding to the thickness of the substrate based on the thickness of the substrate comprises:
- substituting the thickness, d, of the substrate and a refractive index, n, of the substrate into a formula P=d×n, and obtaining the position, P, of the waveform corresponding to the thickness of the substrate.

10. The computer device according to claim 7, wherein adjusting the exposure gap while detecting the exposure gap using the detector until the exposure gap is equal to the intermediary exposure gap comprises:
- detecting the exposure gap by using the detector; and
- moving the substrate using a platform of an exposure machine until the exposure gap is equal to the intermediary exposure gap.

11. The computer device according to claim 7, wherein adjusting the exposure gap to the target exposure gap based on the difference between the target exposure gap and the intermediary exposure gap comprises:
- calculating the difference between the target exposure gap and the intermediary exposure gap; and
- based on the difference between the target exposure gap and the intermediary exposure gap, moving the substrate using a platform of an exposure machine, so that the exposure gap is equal to the intermediary exposure gap.

12. The computer device according to claim 7, wherein after setting the detection range of the detector based on the thickness of the substrate, the method further comprises:
- in case the position of the waveform corresponding to the target exposure gap is within the detection range, adjusting the exposure gap while detecting the exposure gap using the detector until the exposure gap is equal to the target exposure gap.

13. A non-transitory computer-readable storage medium storing a computer program, wherein the method for adjusting the exposure gap according to claim 1 is realized when a processor executes the computer program.

14. The non-transitory computer-readable storage medium according to claim 13, wherein setting the detection range of the detector based on the thickness of the substrate comprises:
- determining the position of the waveform corresponding to the thickness of the substrate based on the thickness of the substrate; and
- setting the detection range based on the position of the waveform corresponding to the thickness of the substrate; the position of the waveform corresponding to the thickness of the substrate and the position of the waveform corresponding to the target exposure gap are outside the detection range.

15. A non-transitory computer program product, wherein the method for adjusting the exposure gap according to claim 1 is performed when instructions in the computer program product are executed by a processor.

16. The non-transitory computer program product according to claim 15, wherein setting the detection range of the detector based on the thickness of the substrate comprises:
- determining the position of the waveform corresponding to the thickness of the substrate based on the thickness of the substrate; and
- setting the detection range based on the position of the waveform corresponding to the thickness of the substrate, wherein the position of the waveform corresponding to the thickness of the substrate and the position of the waveform corresponding to the target exposure gap are outside the detection range.

17. An apparatus for adjusting an exposure gap, comprising:
a first setting module configured for setting a detection range of a detector based on a thickness of a substrate, wherein a position of a waveform corresponding to the thickness of the substrate is outside the detection range;
a second setting module configured to, in case a position of a waveform corresponding to a target exposure gap is outside the detection range, set an intermediary exposure gap within the detection range;
a first adjusting module configured for adjusting the exposure gap while detecting the exposure gap using the detector until the exposure gap is equal to the intermediary exposure gap, wherein the exposure gap is a distance between the substrate and a mask plate; and
a second adjusting module configured for adjusting the exposure gap to the target exposure gap based on a difference between the target exposure gap and the intermediary exposure gap.

18. The apparatus according to claim 17, wherein the first adjusting module comprises:
a detection unit configured for detecting the exposure gap using the detector; and
a first moving unit configured for moving the substrate by using a platform of an exposure machine until the exposure gap is equal to the intermediary exposure gap.

19. The apparatus according to claim 17, wherein the second adjusting module comprises:
a calculating unit configured for calculating the difference between the target exposure gap and the intermediary exposure gap; and
a second moving unit configured to, based on the difference between the target exposure gap and the intermediary exposure gap, move the substrate by using a platform of an exposure machine, so that the exposure gap is equal to the intermediary exposure gap.

20. The apparatus according to claim 17, further comprising:
a third adjusting module configured to, in case of the position of the waveform corresponding to the target exposure gap is within the detection range, adjust the exposure gap while detecting the exposure gap using the detector until the exposure gap is equal to the target exposure gap.

* * * * *